United States Patent [19]
Hocking et al.

[11] Patent Number: 5,431,965
[45] Date of Patent: Jul. 11, 1995

[54] CORELESS REFRACTORY FIBERS

[75] Inventors: Michael G. Hocking; Paulette S. Sidky, both of Guildford, United Kingdom

[73] Assignee: The Secretary of State for Defence in Her Britannic Majesty's Government of the United Kingdom of Great Britian and Northern Ireland, London, United Kingdom

[21] Appl. No.: 64,034

[22] PCT Filed: Jul. 18, 1991

[86] PCT No.: PCT/GB91/01201

§ 371 Date: May 19, 1993

§ 102(e) Date: May 19, 1993

[87] PCT Pub. No.: WO92/02109

PCT Pub. Date: Feb. 6, 1992

[30] Foreign Application Priority Data

Jul. 19, 1990 [GB] United Kingdom ............... 9015921

[51] Int. Cl.$^6$ ................... B05D 3/06; C23C 16/00
[52] U.S. Cl. ..................... 427/545; 427/585; 427/587; 427/557; 427/546; 427/251; 117/87; 117/93; 117/98
[58] Field of Search ........... 427/557, 585, 587, 588, 427/589, 590, 591, 545, 546, 593, 117, 120, 251; 264/81, 1.2, 165; 65/2, 3.12; 156/612, 613, 617.1; 117/84, 87

[56] References Cited

U.S. PATENT DOCUMENTS

| | | | |
|---|---|---|---|
| 2,877,138 | 3/1959 | Vodonik | 427/587 |
| 3,622,369 | 11/1971 | Basche et al. | 427/589 |
| 3,887,722 | 6/1975 | Douglas et al. | 427/585 |
| 4,107,352 | 8/1978 | Hakim | 427/590 |
| 4,142,008 | 2/1979 | DeBolt | 427/590 |
| 4,221,825 | 9/1980 | Guerder et al. | 65/3.12 |
| 4,224,046 | 9/1980 | Izawa et al. | 65/3.12 |
| 4,259,101 | 3/1981 | Tsukuda et al. | 264/81 |
| 4,345,930 | 8/1982 | Basola et al. | 65/2 |
| 4,357,365 | 11/1982 | McCarty | 427/587 |
| 4,676,814 | 6/1987 | Röss et al. | 65/3.12 |
| 4,756,791 | 7/1988 | D'Angelo et al. | 156/613 |
| 5,094,711 | 3/1992 | Narasimhan et al. | 156/613 |
| 5,160,574 | 11/1992 | Pearson et al. | 156/613 |
| 5,294,465 | 3/1994 | Gallagher | 427/585 |
| 5,304,461 | 4/1994 | Inoue et al. | 427/585 |

FOREIGN PATENT DOCUMENTS

| 1104834 | 4/1989 | Japan | 156/613 |
|---|---|---|---|
| WO89/11770 | 11/1989 | WIPO . | |

OTHER PUBLICATIONS

*Webster's 9th New Collegiate Dictionary*, 1990 (no month), Merriam-Webster Inc. Pub., Springfield, Mass. USA. p. 971.

Primary Examiner—Marianne Padgett
Attorney, Agent, or Firm—Nixon & Vanderhye

[57] ABSTRACT

A coreless refractory fiber is made by introducing a filament (16) of a starting material into a chemical vapor deposition (CVD) enclosure (10) and then heating the end (21) of the filament by means of a contactless heating source. The source comprises a conducting coil connected to an AC source in the frequency range HF to UHF and with a linear or strip conducting element (110) connected to it such that the ends of the element is adjacent to the end (21) of the filament. The filament (16) is then withdrawn such that refractory material is continuously built up on its end from the chemical vapors in the enclosure to form a coreless retractory fiber. Whiskers of a coreless refractory material may be made by introducing fine particles of a catalyst material to form droplets and then feeding CVD gases to the droplets (30) to thereby promote crystal growth by precipitation from the supersaturated liquid. The end of the precipitated material within the enclosure is heated by means of a linear conducting element vertically mounted and provide at its free end with a perpendicular conducting disc (111) adjacent and parallel to the platform (22). The platform is then moved vertically from the heat source such that the separation of the droplets (30) from the heating source (111) is maintained constant as chemical vapor is continuously deposited under the droplets (30) from the chemical vapors in the enclosure to form whiskers.

10 Claims, 2 Drawing Sheets

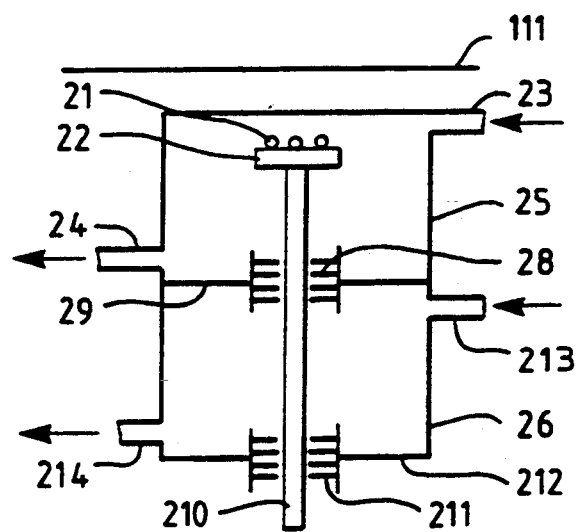
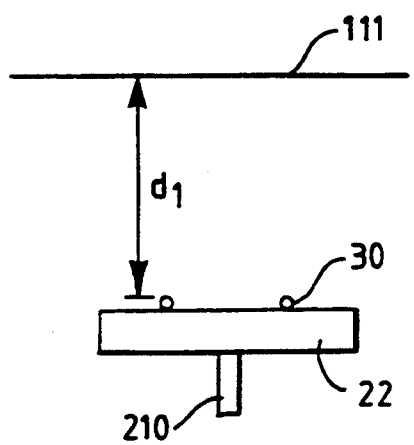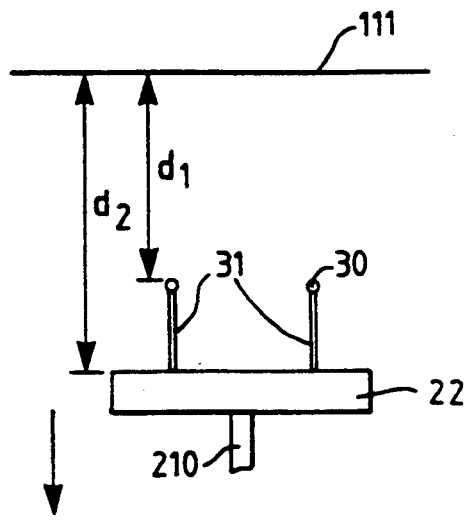

CORELESS REFRACTORY FIBERS

BACKGROUND OF THE INVENTION

1. Field of the Invention

The invention relates to the manufacture of refractory fibers and in particular to coreless fibers.

2. Discussion of Prior Art

GB Patent Application No 8811893 describes a method of radio frequency heating which allows lengths of fine wires to be heated uniformly or with a desired temperature gradient without physical contact with the wire. GB Patent Application No 9005172 further discloses that uniformity of the heating of the wire can be improved by modulating the radio frequency source. These methods allow convenient manufacture of refractory fibers or filaments by chemical vapor deposition (CVD) on a core wire, typically tungsten. Such fibers do not have optimum properties, however, because several well known deleterious core effects impair the properties of the refractory material deposited on the core.

SUMMARY OF THE INVENTION

The object of the present invention is to provide a method for making coreless refractory fibers, filaments or whiskers.

The invention provides, in one form, a method for making a coreless refractory fibers comprising the steps of:
a. introducing one or more electrically conducting filament of a former material into a chemical vapor deposition (CVD) enclosure;
b. heating the end of the filament within the enclosure by means of a contactless heating source, the source comprising a conducting coil connected to an AC source in the radio frequency range HF to UHF and with a linear or strip conducting element connected thereto such that the end thereof remote from the coil is adjacent to the end of the filament; and
c. withdrawing the filament such that refractory material is continuously built up on the end of the filament from the chemical vapor in the enclosure to form a coreless refractory fiber.

Advantageously the fiber is made of tungsten or carbon or a multiple of strands of such materials. In an advantageous arrangement the starting filament is selected to be tungsten and is supported vertically in the CVD enclosure and the linear conducting element of the heating source is arranged to be parallel or perpendicular to the filament. Alternatively the conducting element may be a conducting cylinder, advantageously with an axial slit for viewing, coaxially surrounding the end of the starting filament.

Preferably the CVD enclosure is selected to be cylindrical and provided at the upper end thereof with a gas seal for entry of the filament into the enclosure. Advantageously the gas seal may be formed with a guard enclosure through Which an inert gas is circulated and provided with opposed capillary inlet, open to the atmosphere, and outlet, connected to the CVD enclosure, through which the filament passes. Advantageously a plurality of filaments may be introduced into the CVD enclosure by arranging that the guard enclosure has more than one pair of inlet and outlet through which respective filaments can be passed. In this arrangement the heating source may be arranged such that there is provided a plane conducting strip conducting element and formed such that the plane thereof is parallel to a plane through the ends of the filaments. The quality of the coreless fiber may be enhanced by conducting the deposition of the refractory material (e.g. Si C) under reduced pressure.

In another form the invention provides a method for making whiskers of a coreless refractory material comprising the steps of:
a. introducing fine particles of a catalyst material on to a platform inside a chemical vapor deposition (CVD) enclosure;
b. melting the catalyst material to form one or more droplets;
c. feeding reactive gases to the droplets of liquid catalyst material to thereby promote crystal growth by precipitation from the supersaturated liquid;

characterised in that:
a. the catalyst material is heated within the enclosure by means of a contactless heating source comprising a conducting coil connected to an AC source operating in the frequency range HF to UHF and a linear or strip conducting element connected to the coil and aligned adjacent and parallel to the platform; and
b. maintaining the heating of each droplet by moving the platform vertically so as to maintain constant the distance between the liquid droplets and the conducting element such that chemical vapor is continuously deposited under each liquid drop from the chemical vapor in the enclosure to form whiskers. In one form the conducting element may be mounted vertically and provided at its free end with a perpendicular conducting disc arranged such that the disc is adjacent and parallel to the platform.

BRIEF DESCRIPTION OF THE DRAWINGS

The invention will now be described with reference to the accompanying Drawings of which:

FIG. 2 shows a modified apparatus fop making filaments or whiskers; and

FIGS. 3a and 3b schematically illustrate fiber growth using the FIG 2 arrangement.

DETAILED DESCRIPTION OF PREFERRED EMBODIMENTS

Figure 1:
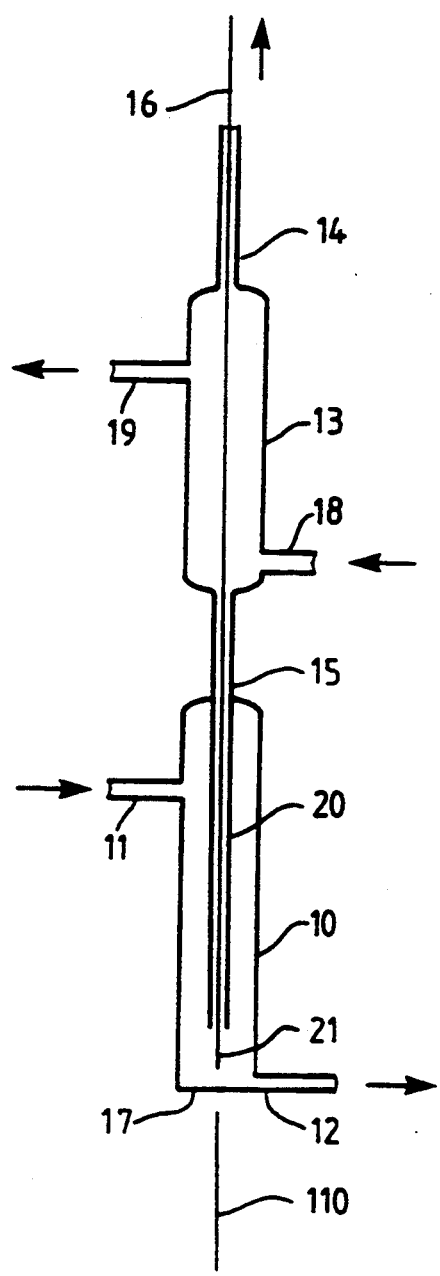
FIG. 1 shows a chemical vapor deposition (CVD) apparatus for manufacture of a continuous copeless fiber.

As shown in FIG. 1 a cylindrical glass CVD vessel 10, vertically supported, has an inlet 11 and an outlet 12 for circulation of a refractory material CVD process gas. At the upper end of the vessel 10 there is provided a guard vessel 13. The guard vessel 13 has an upper capillary tube 14 open to the atmosphere and a lower capillary tube 15 connected to the CVD vessel 10. The arrangment is such that a thin filament 16 to act as a former for chemically depositing the refractory material can be passed through the capillary tubes 14 and 15 such that one end is adjacent to the bottom 17 of the CVD vessel 10 while the upper end is attached to a take-up spool (not shown). An inert guard gas circulates through the guard vessel 13, entering via inlet 18 and leaving via outlet 19. The capillaries are so dimensioned and the CVD process gas and guard gas pressures selected such that the top of the CVD vessel 10 is substantially sealed to prevent escape of the process gas while preventing ingress of atmospheric gases, especially water vapor. In a preferential arrangement, the process gas inlet 11 is near the bottom 17 to ensure that laminar flow occurs. A tube 20 surrounds the filament 16 within the CVD vessel 10, leaving the lower end 21 of the filament exposed to the process gas. The process gas outlet 12 is connected to a vacuum pump via a cold trap. The guard gas outlet 19 is also connected to a vacuum pump. The spool for the filament 16 is preferably housed in a purged glass dome. Aligned perpendicular to the filament 16 and located adjacent to the bottom of the CVD vessel 10 is a linear conducting element 110 of copper or other suitable metal connected via one end of an inductive coil to a radio frequency power supply. This element 110 may be aligned with the filament 16 (as shown) but more power will then be required. The element may take other forms such as a short cylinder, optionally provided with an axial slit for viewing, placed coaxially to the filament at its end.

The rf supply, preferably at 13.56 or 27.12 MHz, is capable of producing a uniform heating in a filament when placed parallel to the filament, as described in GB Patent Application No 8811893. When operated at a frequency in the hf, vhf or vhf bands as shown in FIG. 1 a hot spot is produced at the end 21 of the filament 16 opposed to the conducting element 110. In use, a filament made of tungsten, for example, is inserted through the guard vessel 13 into the CVD vessel 10 and then heated by the rf Source. Once the end 21 of the tungsten filament reaches a critical temperature, process gases form deposits on the end of the tungsten. Then, by continuously withdrawing the filament 16 by winding it on to a take-up spool, CVD occurs continuously on the end of the filament adjacent to the end of the conducting element 110 to produce a fine coreless filament or fiber of refractory material.

The conducting element 110 which radiates energy to heat the filament is formed and disposed so as to avoid significant unwanted heating. In an alternative arrangement the element 110 in the form of a strip could be disposed horizontally in the region of the end 21 of filament 16. In a further arrangement, a plurality of separate tungsten filaments could be provided in a single CVD vessel 10, each filament passing through a respective capillary tube from a sealing guard vessel. In this arrangement a horizontal conducting element in the form of a strip is arranged such that it is parallel to a plane through the ends of the filaments such that a single rf source and radiating element can be used to simultaneously heat the ends of all the filaments. Alternatively a metal cylinder or similar shape (optionally split for viewing) could be placed coaxially around the lower end 10 of the glass vessel. As described in GB Patent Application No 9005172 the rf source is preferably modulated for uniform heating. In the present application requiring spot heating, however, this is not likely to be necessary.

The technique described above whereby filaments are continuously grown by deposition at one localised heated point can also be used to melt fine electrically conducting particles which will allow the deposition of solid single crystal fibers to occur beneath the droplet by the well known vapor-liquid-solid (VLS) mechanism. FIGS. 2 and 3 show an advantageous arrangement for this application. A reaction chamber 25 is formed by part of an enclosure separated by a partition 29 into an upper reaction chamber 25 and a lower guard chamber 26. A growth substrate 22 or platform is supported on a piston 210 which can be moved up or down within the enclosure via a series of baffles 28,211 provided respectively in the partition 211 and the base 212 of the enclosure. Fine conducting particles 21 of a solid catalyst in the range of tens of microns diameter are dispersed on the substrate 22. An rf conducting element 111, which may be a plane strip or disc is placed horizontally above and parallel to the growth substrate 22. Appropriate reactive gases enter the reaction chamber at inlet 23 and exit at outlet 24 and guard gas enters the guard chamber 26 at inlet 213 and leaves at outlet 214. When the rf is in the hf, vhf, or uhf bands, the particles 21 melt to form liquid droplets 30 as shown in FIG. 3a. This phenomenon can be utilized to make use of the VLS mechanism for the growth of whiskers. According to the VLS mechanism, the reactive gases are fed into the molten droplets 30 from the vapor at the vapor-liquid interface. Crystal growth occurs by the precipitation from the supersaturated melt at the liquid-solid interface. As the crystal 31 grows under the molten droplet (FIG. 3b), the platform consisting of the growth substrate 22 and the attached piston 210 is withdrawn in order to keep the distance between the conducting plane 111 and the droplets 30 constant.

A particularly advantageous feature of the present invention is that the contactless method of heating as described preferentially heats the ends of the filaments or fibers as they are formed.

We claim:

1. A method for making a coreless refractory fiber comprising the steps of:

introducing a filament of a starting material having at least one end into a chemical vapor deposition (CVD) enclosure having chemical vapors;

heating said at least one end of the filament within the enclosure by means of a contactless heating source, the source comprising a conducting coil connected to an AC source in the frequency range HF to UHF and a linear conducting element having one end connected to the coil and another end remote from the coil is located adjacent to said at least one end of the filament; and withdrawing the filament such that refractory material is continuously built up as a refractory fiber beginning on said at least one end of the filament from the chemical vapors in the enclosure.

2. A method for making a coreless refractory fiber as claimed in claim 1 wherein the filament is made of one of tungsten and carbon.

3. A method for making a coreless refractory fiber as claimed in claim 1 wherein the filament is supported vertically in the CVD enclosure and the linear conducting element of the heating source is arranged to be one of parallel and perpendicular to the filament.

4. A method for making a coreless refractory fiber as claimed in claim 1 wherein the CVD enclosure is a cylinder oriented with a longitudinal axis in the vertical direction and provided at an upper end thereof with a gas seal for entry of the filament into the encosure.

5. A method for making a coreless refractory fiber as claimed in claim 4 wherein the gas seal comprises a chamber through which an inert gas is circulated and provided with opposed capillary inlet open to the atmosphere, and outlet connected to the CVD enclosure, through which the filament passes.

6. A method for making a coreless refractory fiber as claimed in claim 5 wherein a plurality of filaments are introduced into the CVD enclosure by arranging that the gas seal has a plurality of pairs of inlets and outlets through which respective filaments can be passsed.

7. A method for making a coreless refractory fiber as claimed in claim 6 wherein the heating source is arranged such that there is provided a plane conducting disc attached to the end of the linear conducting element and supported such that the plane thereof is parallel to a plane through the ends of the filaments.

8. A method for making a coreless refractory fiber as claimed in claim 1 wherein the method is carried out at a pressure less than atmospheric.

9. A method for making whiskers of a coreless refractory material comprising the following steps:
   a. introducing particles of a catalyst material on to a platform inside a chemical vapor deposition (CVD) enclosure;
   b. melting the catalyst material to form one or more supersaturated liquid droplets;
   c. feeding reactive gases to the droplets of liquid catalyst material to thereby promote crystal growth by precipitation from the supersaturated liquid droplets;
   d. heating the catalyst material within the enclosure by means of a contactless heating source comprising a conducting coil connected to an AC source operating in the frequency range HF to UHF and a linear or strip conducting element connected to the coil and aligned adjacent and parallel to the platform; and
   e. maintaining the heating of each of said droplet by moving the platform vertically so as to maintain constant the distance between the liquid droplets and the conducting element such that chemical vapor is continuously deposited under each liquid droplet to form whiskers.

10. A method for making a coreless refractory fiber as claimed in claim 9 wherein the conducting element is mounted vertically and provided at a free end with a perpendicular conducting disc arranged such that the disc is adjacent and parallel to the platform.

* * * * *